(12) United States Patent
Doi et al.

(10) Patent No.: US 9,236,329 B2
(45) Date of Patent: Jan. 12, 2016

(54) SEMICONDUCTOR MEMORY CARD

(71) Applicant: Kabushiki Kaisha Toshiba, Tokyo (JP)

(72) Inventors: Kazuhide Doi, Kanagawa (JP); Soichi Homma, Kanagawa (JP); Katsuyoshi Watanabe, Kanagawa (JP); Taku Nishiyama, Kanagawa (JP); Takeshi Ikuta, Kanagawa (JP); Naohisa Okumura, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/786,035

(22) Filed: Mar. 5, 2013

(65) Prior Publication Data

US 2014/0070381 A1     Mar. 13, 2014

(30) Foreign Application Priority Data

Sep. 12, 2012   (JP) ................................ P2012-200159

(51) Int. Cl.
*H01L 23/495*     (2006.01)
*H01L 23/00*      (2006.01)
(Continued)

(52) U.S. Cl.
CPC ........ *H01L 23/495* (2013.01); *G06K 19/07732* (2013.01); *H01L 21/0201* (2013.01); *H01L 23/3107* (2013.01); *H01L 23/49551* (2013.01); *H01L 23/49558* (2013.01); *H01L 23/49575* (2013.01); *H01L 23/49589* (2013.01); *H01L 24/80* (2013.01); *H01L 24/05* (2013.01); *H01L 24/45* (2013.01); *H01L 24/48* (2013.01); *H01L 24/49* (2013.01); *H01L 2224/02166* (2013.01); *H01L 2224/04042* (2013.01); *H01L 2224/05624* (2013.01); *H01L 2224/05644* (2013.01);
(Continued)

(58) Field of Classification Search
CPC ................. H01L 2924/00; H01L 2224/48091; H01L 2224/48227; H01L 2924/00014; H01L 2224/73265; H01L 2224/32225; H01L 2924/00012; H01L 24/48; H01L 2924/01079; H01L 2224/48247
USPC ........ 438/25–35; 257/81, 82, 91, 98, 99, 100, 257/116, 117, 432–437, 749, 257/E33.056–E33.059, E25.032
See application file for complete search history.

(56) References Cited

U.S. PATENT DOCUMENTS 5,822,190 A    10/1998   Iwasaki
6,049,975 A *   4/2000   Clayton ........................ 29/832
(Continued)

FOREIGN PATENT DOCUMENTS

EP       0121268 A1    10/1984
JP       01-128888      5/1989
JP       2012-053554 A  3/2012

OTHER PUBLICATIONS

Korean Office Action dated Mar. 26, 2015 for Application No. K20292/169110.
JP Rejection dated Dec. 26, 2014 for Application No. 2012-200159.

*Primary Examiner* — David Vu
*Assistant Examiner* — Jonathan Han
(74) *Attorney, Agent, or Firm* — Patterson & Sheridan, LLP

(57) ABSTRACT

A semiconductor memory card includes a lead frame having external connection terminals, a controller chip mounted on the lead frame and a memory chip mounted on the lead frame. The lead frame, the controller chip, and the memory chip are sealed with a sealing resin layer that has a surface at which the external connection terminals are exposed and a recess surrounding the external connection terminals.

9 Claims, 14 Drawing Sheets

(51) Int. Cl.
*H01L 21/02* (2006.01)
*H01L 23/31* (2006.01)
*G06K 19/077* (2006.01)

(52) U.S. Cl.
CPC . *H01L2224/05664* (2013.01); *H01L 2224/451* (2013.01); *H01L 2224/4813* (2013.01); *H01L 2224/48091* (2013.01); *H01L 2224/48137* (2013.01); *H01L 2224/48247* (2013.01); *H01L 2224/48463* (2013.01); *H01L 2224/48465* (2013.01); *H01L 2924/1815* (2013.01); *H01L 2924/19041* (2013.01); *H01L 2924/19105* (2013.01); *H01L 2924/19107* (2013.01)

(56) References Cited

U.S. PATENT DOCUMENTS

| | | | |
|---|---|---|---|
| 6,897,550 B1 * | 5/2005 | Zwenger et al. | 257/666 |
| 6,900,527 B1 | 5/2005 | Miks et al. | |
| 6,924,547 B2 * | 8/2005 | Kanemoto et al. | 257/666 |
| 7,057,268 B1 * | 6/2006 | d'Estries | 257/679 |
| 7,605,454 B2 * | 10/2009 | Wehrly, Jr. | 257/679 |
| 7,768,110 B2 * | 8/2010 | Nishizawa et al. | 257/679 |
| 7,855,099 B2 * | 12/2010 | Ni et al. | 438/106 |
| 2003/0227075 A1 | 12/2003 | Kanemoto | |
| 2007/0155046 A1 * | 7/2007 | Takiar et al. | 438/106 |
| 2008/0145968 A1 | 6/2008 | Hiew et al. | |

* cited by examiner

SEMICONDUCTOR MEMORY CARD

CROSS-REFERENCE TO RELATED APPLICATION

This application is based upon and claims the benefit of priority from Japanese Patent Application No. 2012-200159, filed Sep. 12, 2012; the entire contents of which are incorporated herein by reference.

FIELD

Embodiments described herein relate generally to a semiconductor memory card.

BACKGROUND

A memory card (semiconductor memory card) having built-in NAND flash memory have been getting smaller while storage capacity has been increasing. In order to achieve higher capacity, increasing the storage density of the memory chips themselves and including more memory chips on the card are being developed in parallel. In general, a memory card is composed of semiconductor chips such as a memory chip and a controller chip on an interconnection substrate (e.g., a circuit board) having external connection terminals, as well as semiconductor chips sealed in a resin layer formed on the interconnection substrate. In addition, attempts have been made to incorporate semiconductor chips such as memory chip and controller chip, and chip component such as a capacitor and a fuse, on a lead frame having external connection terminals to realize the reduction in cost of the memory card.

In a manufacturing process of a memory card using a lead frame, the semiconductor chips and the other chip components are mounted on the lead frame, and then a sealing resin layer that seals the semiconductor chips and the chip components as well as the lead frame are formed. One requirement of the step of forming the sealing resin layer is to have the surface of external connection terminals to be exposed. As a result, the sealing resin layer is formed through application of transfer molding or the like using a molding that can expose the surface of external connection terminals. However, it is difficult to prevent or control the generation of resin burrs during molding since the external connection terminals of memory card is configured on one side of surface of the sealing resin layer. Usually, a part of the external connection terminals is covered by resin, as a result of which connectivity of the external connection terminals with the external device becomes diminished.

DETAILED DESCRIPTION

Embodiments provide a semiconductor memory card and its manufacturing method in which the reduction in cost is realized by an improved process of exposing external connection terminals.

In general, according to one embodiment, a semiconductor memory card includes: a lead frame including a plurality of external connection terminals and a lead portion having a plurality of leads with at least part of them being connected to the external connection terminals; a controller chip mounted on the lead frame and electrically connected to at least one lead; a memory chip mounted on the lead frame and electrically connected to the controller chip; and a sealing resin layer that seals the lead frame, the controller chip, and the memory chip together. The sealing resin layer has a surface by which the external connection terminals are exposed and a recess that surrounds the perimeter of the external connection terminals.

Exemplary embodiments of a semiconductor memory card will be explained below in detail with reference to the accompanying drawings. The present disclosure is not limited to the following example embodiments.

(First Embodiment)

Figure 1:
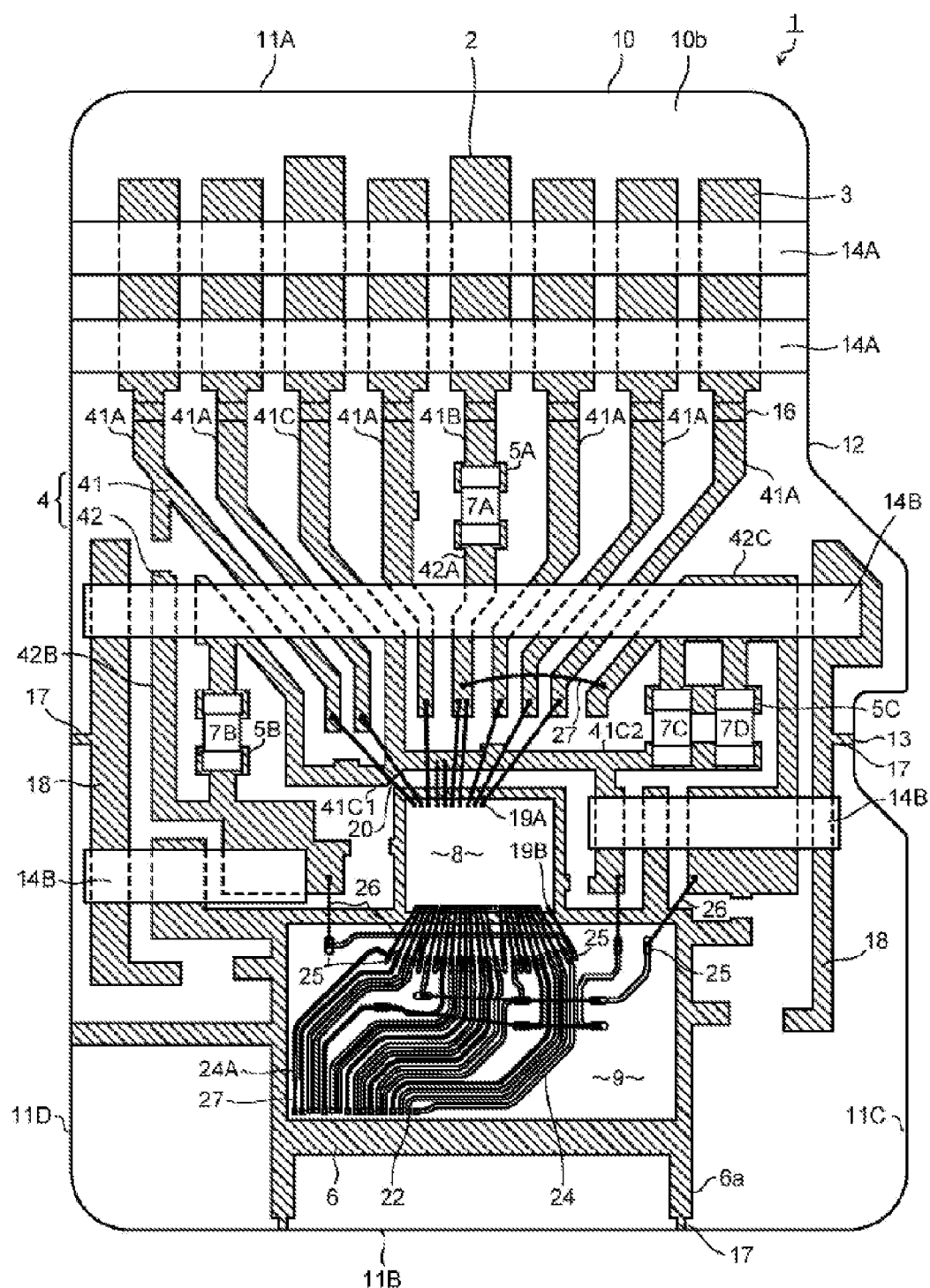
FIG. 1 is a top view illustrating a semiconductor memory card according to a first embodiment.
Figure 2:
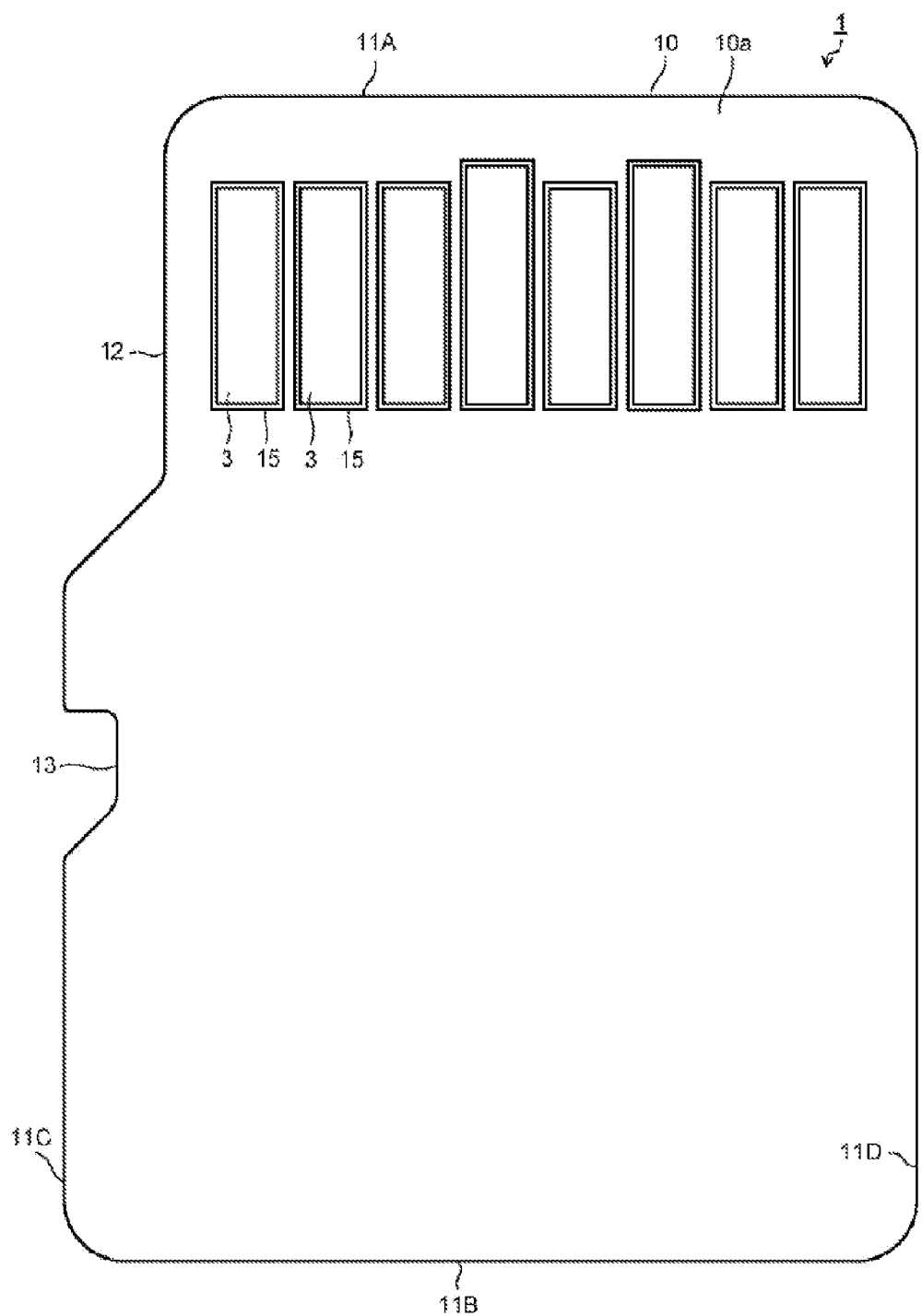
FIG. 2 is a bottom view of the semiconductor memory card illustrated in FIG. 1.
Figure 3:
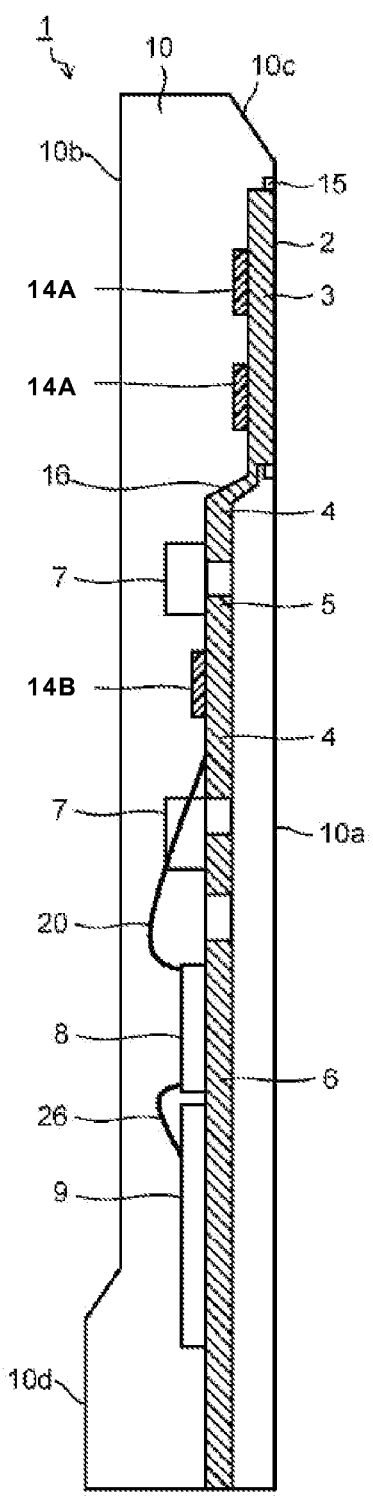
FIG. 3 is a cross-sectional view of the semiconductor memory card illustrated in FIG. 1.

FIG. 1 and FIG. 3 are figures illustrating a semiconductor memory card according to a first embodiment. FIG. 1 illustrates a top view of the semiconductor memory card of the first embodiment and a top view illustrating an inside configuration of the semiconductor memory card; FIG. 2 illustrates a bottom view of the semiconductor memory card of the first embodiment. FIG. 3 is a cross-sectional view of the semiconductor memory card according to the first embodiment cut in a long edge direction (same direction as a card slot insertion direction). The semiconductor memory card 1 illustrated in these figures may be used as a memory card compatible with various standards.

The memory card 1 provides a lead frame 2 that includes multiple external connection terminals 3, a lead portion 4 having multiple leads with at least part connected to the external connection terminals 3, a chip component mounting portion 5 provided on the lead portion 4, and a semiconductor chip mounting portion 6. A chip component (passive component) 7 is provided on the chip component mounting portion 5. A controller chip 8 and a memory chip 9 such as NAND flash memory are provided on the semiconductor chip mounting portion 6. The controller chip 8 is a semiconductor chip that performs writing of data into the memory chip 9 and reading of data stored in the memory chip 9.

The lead frame 2 is sealed by a sealing resin layer 10. The sealing resin layer 10 is formed by transfer-molding a sealing resin such as epoxy resin so as to seal the lead frame 2 together with the chip component 7, the controller chip 8, and the memory chip 9, while exposing surfaces of the external connection terminals 3. The sealing resin layer 10 has an almost rectangular shape and covers the surfaces of the memory card 1. A first surface 10a (FIG. 2) exposing the external connection terminals 3 from the sealing resin layer 10 corresponds to the back side of the memory card 1. On the opposite side of the memory card 1 from the first surface 10a, a second plane 10b (FIG. 1), corresponds to the front side of the memory card 1.

Among contour edges 11 of the sealing resin layer 10, a first short edge 11A near the external connection terminals 3 corresponds to an end portion of the memory card 1. An inclined portion 10c of the sealing resin layer 10 is provided at the end of sealing resin layer 10 indicating an anterior (forward) direction of the memory card 1. A second short edge 11B of the sealing resin layer 10 corresponds to posterior (back) portion of the memory card 1. There is a handle portion 10d which is a bulging portion of the resin layer to extending past the primary plane of the surface 10b near posterior portion of the sealing resin layer 10. A notch 12 and a constriction 13 are formed on a first long edge 11C of the sealing resin layer 10 so as to indicate a direction of front and back of the memory card 1. A second long edge 11D of the sealing resin layer 10 is generally a linear shape.

Ends of the of external connection terminals 3 are included within sealing resin layer 10. In the first embodiment, no hanging leads are provided at the end of the external connection terminals 3. Thus, there are no remaining hanging leads at the end of the sealing resin layer 10. The plurality of external connection terminals 3 are separated from a frame (which is not illustrated), hence a fixing tape 14A is adhered on terminals. The plurality of external connection terminals 3 is held by the fixing tape 14A. The surface of each of the plurality of external connection terminals 3 is exposed on the first surface 10a. In order to expose the surface of the external connection terminals 3 to the first surface, a connection portion of the external connection terminals 3 of the lead frame 2 and the lead portion 4 is bent; and a recess portion 15 surrounding the external connection terminals 3 is provided on the first surface 10a.

More specifically, while the external connection terminals 3 are exposed at the first surface 10a, the lead portion 4 and the semiconductor chip mounting portion 6 and others connected to the external connection terminals 3 are embedded within the sealing resin layer 10. Thus, the lead frame 2 has a depressed portion 16 which is bent at the connection portion to the external connection terminals 3 and the lead portion 4. The depressed portion 16 allows the lead portion 4 and the semiconductor chip mounting portion 6 and others to be located within the sealing resin layer 10 while the external connection terminals 3 are exposed to the outside (i.e., not embedded completely within the sealing resin 10). The depressed portion 16 has a shape which bends upward and then bends back the connection portion to the external connection terminals 3 and the lead portion 4 in a horizontal direction. Having the depressed portion 16 on the lead frame 2 enables improved resin-sealing of a configuration portion (lead portion 4, chip component mounting portion 5, semiconductor chip mounting portion 6 and others) of the lead frame 2 except the external connection terminals 3, the chip component 7, the controller chip 8, and the memory chip 9, while exposing the external connection terminals 3 to the outside.

Figure 4:
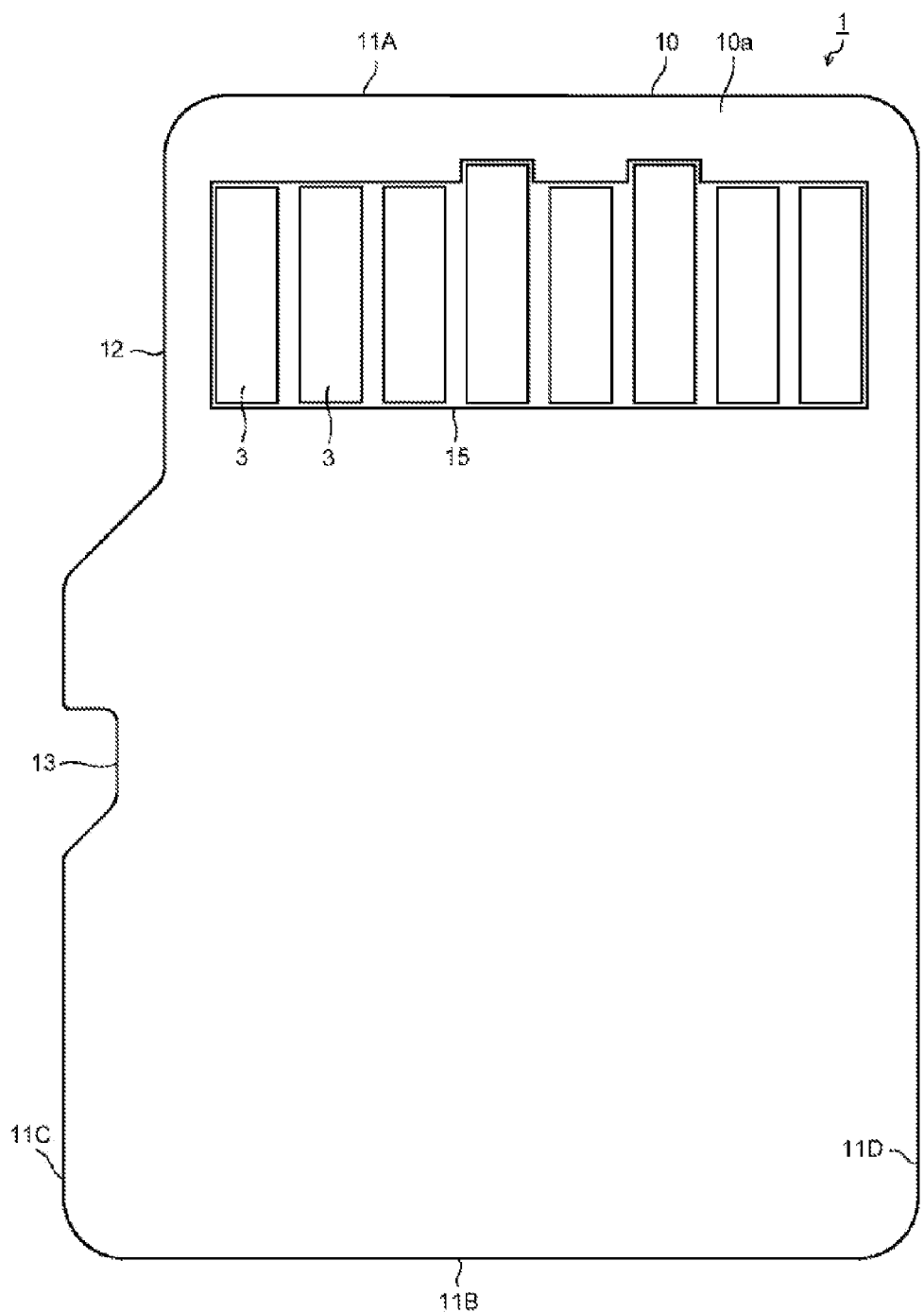
FIG. 4 is a bottom view of the semiconductor memory card illustrated in FIG. 1.

The memory card 1 in the first embodiment has the depressed portion 16 provided on the lead frame 2 in order to improve the exposure of the external connection terminals 3 to the outside, and additionally the recess portion 15 that exposes the surface and a part of the side surface of the external connection terminals 3 on the first surface 10a of the sealing resin layer 10. The recess portion 15 is placed such as it surrounds the external connection terminals 3. The recess portion 15 can be also placed to surround each of the plurality of external connection terminals 3 individually as illustrated in FIG. 2, or to surround the plurality of external connection terminals 3 collectively as illustrated in FIG. 4. The recess portion 15 has a shape that exposes a part of a side surface 3b, in addition to a surface 3a of the external connection terminals 3, as magnified and illustrated in FIGS. 5 and 6. Having such recess portion 15 on the first surface 10a improves the exposure of the surface 3a of the external connection terminals 3. In addition, having the recess portion 15 by which surrounding the external connection terminals 3 stabilizes the outer shape of the external connection terminals 3. Thus, it will be possible to establish full function of the external connection terminals 3.

The recess portion 15 is indented from a level of the first surface 10a of the sealing resin layer 10. A depth D1 of the recess portion 15 from a level of the first surface 10a is preferably in a range of 10 μm to 300 μm. In case the depth D1 of the recess portion 15 is smaller than 10 μm, the surface 3a of the external connection terminals 3 may not be exposed completely in actual manufacturing processes. In case the depth D1 of the recess portion 15 is larger than 300 μm, it may be difficult to eject the memory card 1 potentially because the recess portion 15 will become stuck to a terminal on a card socket side, when removing the memory card 1 from a socket of an external device. The outer shape of the recess portion 15 can surround the whole perimeter of the external connection terminals 3 and a shape of exposing a part of the side surface 3b of the external connection terminals 3; the width (the distance between the side surface 3b of the external connection terminals 3 and a wall side 15a of the sealing resin layer 10) of the recess portion 15 is not particularly limited to any specific value.

Figure 5:
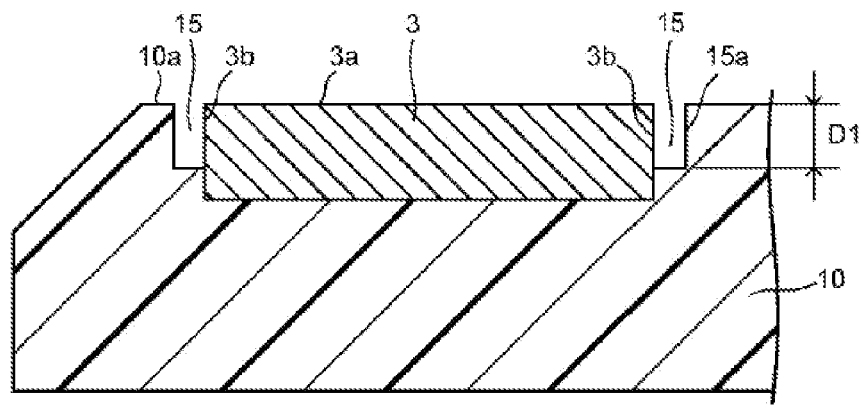
FIG. 5 is a cross-sectional view of a first example of external connection terminals and a recess portion provided in a sealing resin layer of the semiconductor memory card illustrated in FIG. 1.
Figure 7:
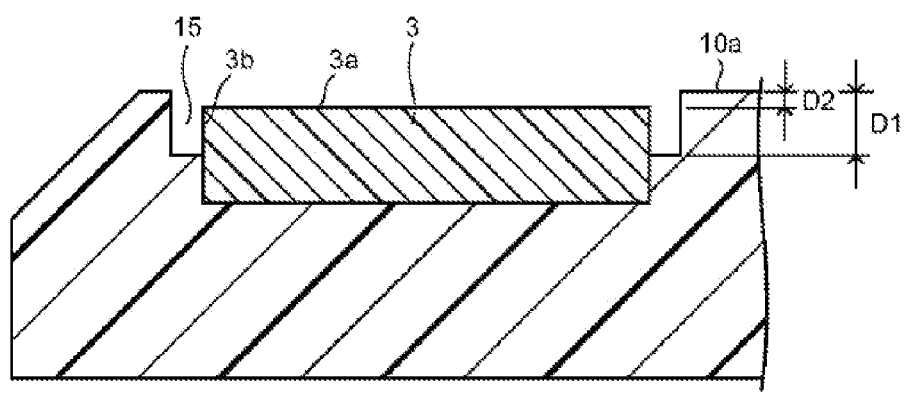
FIG. 7 is a cross-sectional view of a second example of external connection terminals and a recess portion provided in a sealing resin layer of the semiconductor memory card illustrated in FIG. 1.

FIG. 5 illustrates a structure with almost identical heights of the surface 3a and the first surface 10a. However, the configuration structure of the external connection terminals 3 is not limited to this. As illustrated in FIG. 7, the external connection terminals 3 can be arranged so that the surface 3a is indented from a level of the first surface 10a. However, if a depth D2 of the surface 3a from a level of the first surface 10a of the sealing resin layer 10 is too deep, the usability of inserting and removing the memory card 1 may become diminished; thus, the depth D2 is preferably less than 100 μm. Indenting the surface 3a of the external connection terminals 3 can prevent a formation of scratches and the development of a wear on the external connection terminals 3. In addition, it can also prevent the protrusion of a terminal surface from the first surface 10a at the time of formation of a metallic plating film on the surface 3a of the external connection terminals 3, which is relevant to a second embodiment described below.

Figure 8A:
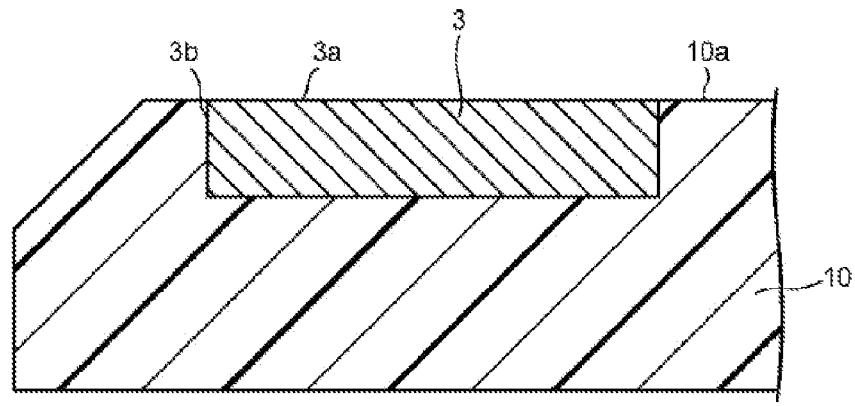
FIGS. 8A and 8B are cross-sectional views illustrating a manufacturing step of the recess portion illustrated in FIG. 5.

The recess portion 15 on the sealing resin layer 10 can be formed by irradiating laser, using ultraviolet light, or processing with plasma, for example, on the sealing resin layer 10 and removing a portion corresponding to the recess portion 15. Manufacturing steps of the recess portion 15 will be described with reference to FIGS. 8A and 8B. According to this example process, the chip component 7, the controller chip 8, and the memory chip 9 are first mounted onto the lead frame 2 and then the sealing resin layer 10 is formed to seal these parts and the lead frame 2 together. The sealing resin layer 10 is formed by transfer molding, for example. Thus, the side surface 3b of the external connection terminals 3 becomes covered with the sealing resin layer 10 as illustrated in FIG. 8A.

Figure 8B:
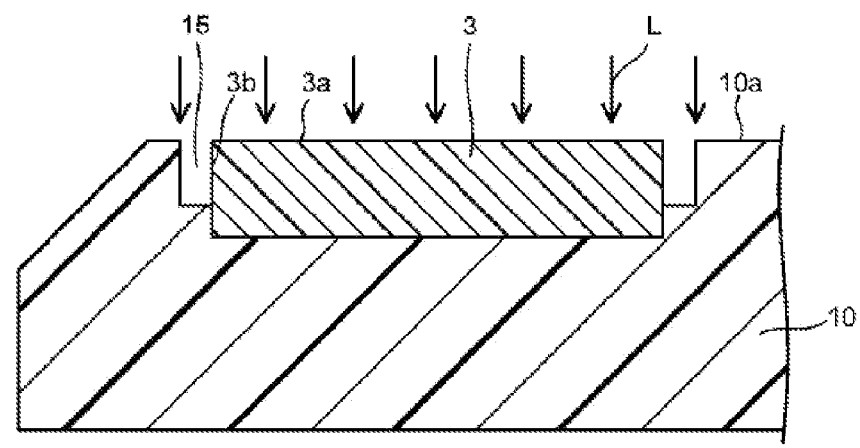

If the side surface 3a of the external connection terminals 3 is set on the same plane as the first surface 10a of the sealing resin layer 10, the sealing resin layer 10 will not be formed on the surface 3a because the surface 3a of the external connection terminals 3 is covered with the molding die. However, it is difficult to control the generation of resin burr on the surface 3a with a regular transfer molding. Thus, such a process may not prevent at least a part of the surface 3a from being covered by the resin at the time of the formation of the sealing resin layer 10. Therefore, as illustrated in FIG. 8B, by irradiating a laser light L to form the recess portion 15 and on the top of the surface 3a of the external connection terminals 3, the resin on the surface 3a can be removed when the recess portion 15 is formed. Ultraviolet light or a plasma process can be applied instead of laser light L.

Figure 6:
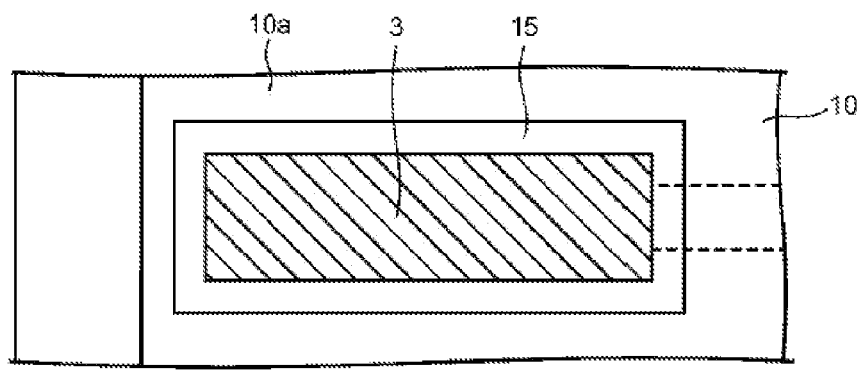
FIG. 6 is a plane view of external connection terminals and a recess portion illustrated in FIG. 5.

Irradiation using laser light L will remove the resin on the surface 3a and form the recess portion 15 that exposes a part of the side surface 3b of the external connection terminals 3 so as to surround whole perimeter of external connection terminals 3 simultaneously. The recess portion 15 may be formed to surround the perimeter of each of the external connection terminals 3 individually as illustrated in FIGS. 2 and 6, or to surround the external connection terminals 3 collectively as illustrated in FIG. 4. Formation of such recess portion 15 in the sealing resin layer 10 enables secure exposure of the surface 3a of the external connection terminals 3 and stabilization of the outer shape of the external connection terminals 3. Thus, it will be possible to establish full function of the external connection terminals 3.

The lead portion 4 has leads 41 which are directly connected to the external connection terminals 3, and leads 42 which are electrically independent of the external connection terminals 3. Out of these leads 41 and 42, one end portion of each of the first, second and third leads 41A, 41B and 41C are directly connected to the external connection terminals 3. The other end portion of leads 41A is exposed in an area in the vicinity of the controller chip 8. A first chip component mounting portion 5A is provided on the second lead 41b and a fourth lead 42A which is electrically independent of the second lead 41B. On the first chip component mounting portion 5A, a first chip component 7A such as a fuse is mounted while being electrically connected to the second and the fourth lead 41B and 42A, respectively. The fourth lead 42A is routed around to the vicinity of the controller chip 8.

The third lead 41C is routed around the area in the vicinity of the controller chip 8, and is then branched. On one branch portion 41C1 of the third lead 41C and a fifth lead 42B electrically independent of the branch portion 41C1, a second chip component mounting portion 5B is provided. On the second chip component mounting portion 5B, a second chip component 7B such as a capacitor is mounted while being electrically connected to the branch portion 41C1 of the third lead 41C and the fifth lead 42B. Other branch portion 41C2 of the third lead 41C and a sixth lead 42C electrically independent of the branch portion 41C2, a third chip component mounting portion 5C is provided. On the third chip component mounting portion 5C, a third chip component 7C and a fourth chip component 7D, respectively, such as capacitors are mounted while being electrically connected to the branch portion 41C2 of the third lead 41C and the sixth lead 42C. The fifth and sixth leads 42B and 42C, respectively, are led around to the vicinity of the memory chip 9.

The semiconductor chip mounting portion 6 has an extended portion 6a that is extended toward the short edge 11B of the sealing resin layer 10, and to these extended portions 6a, hanging leads 17 connected to the not-shown frame are respectively provided. In addition, the lead frame 2 has a fixed portion 18 provided along with the long edge 11C and 11D of the sealing resin layer 10. On the fixed portion 18, the hanging leads 17 are provided. The semiconductor chip mounting portion 6 is electrically independent of the fixed portion 18. The semiconductor chip mounting portion 6 and a part of the lead portion 4 is held by the fixing tape 14B adhered to the fixed portion 18 where the hanging leads 17 are provided. The fixing tape 14B is adhered from the fixed portion 18 towards the semiconductor chip mounting portion 6, a part of the lead portion 4, and fixes the semiconductor chip mounting portion 6 and a part of the lead portion 4 to the fixed portion 18 supported by the hanging leads 17.

Thus, the semiconductor chip mounting portion 6 is electrically independent between both side surfaces of the sealing resin layer 10 (the surfaces having the long edge 11C and 11D). More specifically, the semiconductor chip mounting portion 6 is not conducted through the hanging leads 17 provided on the both sides of the sealing resin layer 10, and is electrically independent between the hanging leads 17 on both side surfaces. By applying the semiconductor chip mounting portion 6 as above, even in a case where the both side surfaces of the sealing resin layer 10 are brought into contact with an external conduction member or the like, there is no chance that the semiconductor chip mounting portion 6 is short-circuited. Therefore, even in a case where a portion between the both side surfaces of the sealing resin layer 10 is short-circuited, a short-circuit failure of the controller chip 8 and the memory chip 9 can be suppressed, which enables to enhance reliability of the memory card 1.

The controller chip 8 and the memory chip 9 are exposed on the semiconductor chip mounting portion 6 and generally have a rectangular outer shape. The controller chip 8 is exposed between the external connection terminals 3 and the memory chip 9. More specifically, the controller chip 8 is closer to the side external connection terminals 3 than the memory chip 9. The controller chip 8 has electrode pads 19A arranged along the long edge on the side close to the external connection terminals 3, and electrode pads 19B arranged along the long edge on the side close to the memory chip 9. The electrode pads 19A close to the external connection terminals 3 of the controller chip 8 are electrically connected to the first, third and fourth leads 41A, 41C and 42A via metal wires 20.

Figure 9:
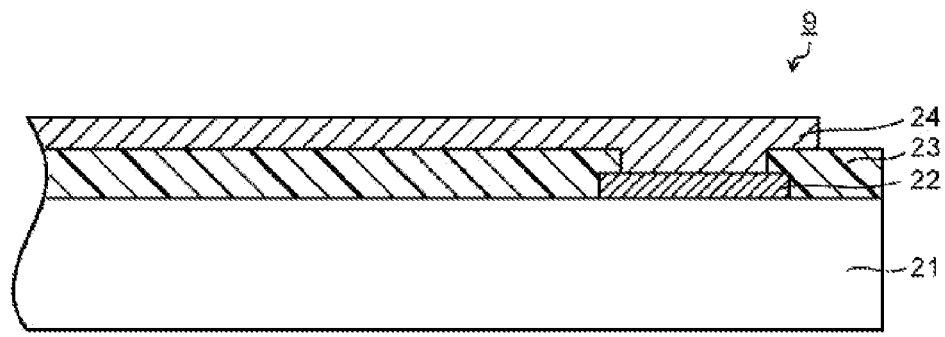
FIG. 9 is a cross-sectional view of a first example of a rewiring layer of a memory chip on the semiconductor memory card illustrated in FIG. 1.

As illustrated in FIG. 9, the memory chip 9 has a chip body 21 having a semiconductor element portion (and potentially others whose illustrations are omitted), electrode pads 22 formed on the chip body 21, an insulating resin film 23 formed to cover a surface of the chip body 21 while exposing the electrode pads 22, and a rewiring layer 24 formed on the insulating resin film 23. Depending on the arrangement and the type of the electrode pads 19, 22 of the controller chip 8 and the memory chip 9, there may arise a need for relocating the electrode pads 22 of the memory chip 9. The rewiring layer 24 provided on the insulating resin film (protective film) 23 made of polyimide resin or the like is for relocating (re-routing connections to) the electrode pads 22 to a desired position on the memory chip 9; for example, one end portion of the rewiring layer 24 is electrically connected to the electrode pads 22, and the other end portion thereof has connection pads 25 to be bonding portion of the metal wire.

In consideration of the required bonding property of a metal wire with respect to the rewiring layer 24, at least an uppermost layer of the rewiring layer 24 is preferably formed of Al, an Al alloy such as Al-0.5 wt % Cu alloy, or a noble metal material such as Au and Pd. Further, when formability and an adhesiveness of the rewiring layer 24 with respect to an upper portion of the insulating resin film 23 are taken into consideration, a lowermost layer of the rewiring layer 24 is preferably formed of Ti, Cr or the like. As example forms of the rewiring layer 24, a stacked film such as an Al/Ti, Al—Cu/Ti, Au/Ni/Ti, or Au/Ni/Cu/Ti may be used. When the uppermost layer of the rewiring layer 24 is formed of an Al layer (including an Al alloy layer) or a noble metal layer, a thickness of the uppermost layer is preferably 2 µm or more for achieving the required bonding properties. If the thickness exceeds 5 µm, no further improvement in bonding will be obtained, so that the thickness of the uppermost layer is preferably 5 µm or less.

In a plurality of rewires (wires) that configure the rewiring layer 24, one end portions of at least some of rewires 24A are electrically connected to the electrode pads 22, and the connection pads 25 are formed on the other end portions. To the connection pads 25 formed on the end portions of the rewires 24A, one end portions of metal wires 26 are bonded. The other end portions of the metal wires 26 are bonded to the electrode pads 19B of the controller chip 8 and the leads 41C, 42B, and 42C. More specifically, the rewires 24A are electrically connected to the electrode pads 19B of the controller chip 8 and the leads 41C, 42B, and 42C via the metal wires 26.

Figure 10:
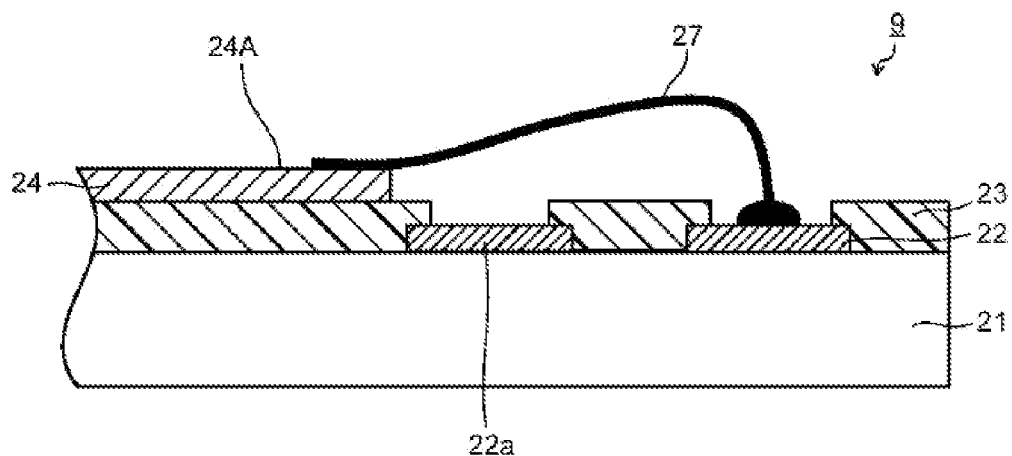
FIG. 10 is a cross-sectional view of a second example of a rewiring layer of a memory chip on the semiconductor memory card illustrated in FIG. 1.

An electrical connection structure of the rewires 24A and the electrode pads 22 may be a directly connected structure as illustrated in FIG. 9, or may be a structure connected via metal wires 27 as illustrated in FIG. 10. In such a case other electrode pads (electrode pads 22a having a different electric potential) exist in the vicinity of the electrode pads 22 to which the rewire 24A is connected, as illustrated in FIG. 10, the rewires 24A can be connected to the electrode pads 22 by disposing the metal wire 27 so as to step over the electrode pads 22a having the different electric potential. The step-over structure with the use of the metal wire 27 is also effective for a structure of stepping over a rewire or leads having a different electric potential. The fourth lead 42A is electrically connected to the sixth lead 42C having the same electric potential via the metal wire 27 so as to step over the first leads 41A having a different electric potential. By applying the step-over structure with the use of the metal wire 27, it is possible to more easily form a circuit through use of the rewiring layer 24 having a monolayer structure.

The memory card 1 in the first embodiment wherein the recess portion 15 surrounding the perimeter of the external connection terminals 3 is provided on the first surface 10a of the sealing resin layer 10 while exposing the surface 3a of the external connection terminals 3 and a part of the side surface 3b. Thus, the reduction in cost of the memory card 1 is realized by using the lead frame 2 and the exposure of the external connection terminals 3 can be also improved. In addition, the outer shape of the external connection terminals 3 is also stabilized. Therefore, the connection reliability of the external connection terminals 3 of the memory card 1 to an external device, namely the operation reliability of the memory card 1 can be enhanced.

(Second Embodiment)

Figure 11:
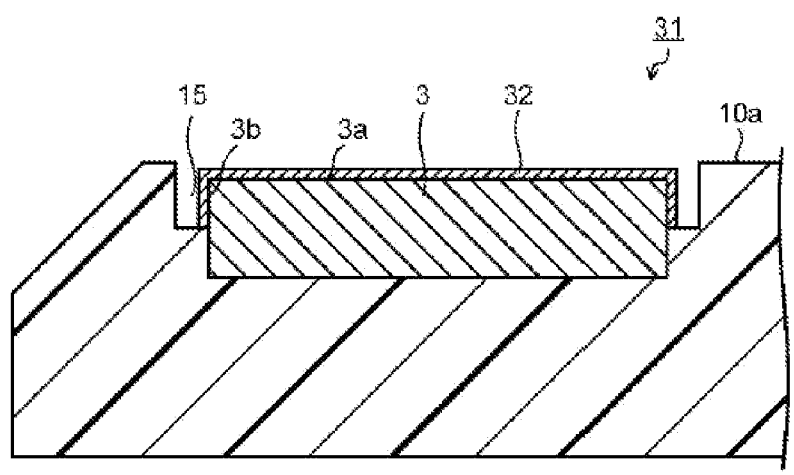
FIG. 11 is an enlarged cross-sectional view of external connection terminals on a semiconductor memory card according to a second embodiment.
Figure 18:
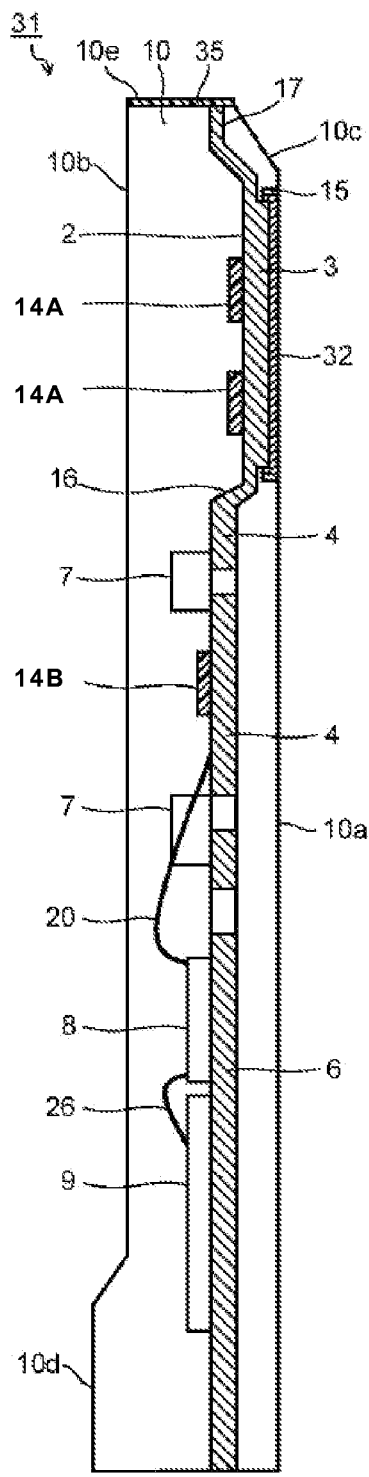
FIG. 18 is a cross-sectional view of the semiconductor memory card having external connection terminals plated according to the fourth technique.

Next, a memory card according to a second embodiment will be described with reference to FIGS. 11 and 18. The portions which are the generally same as those of the first embodiment are denoted by the same reference numerals, and the corresponding parts of the explanation thereof will be omitted. In a memory card 31 of the second embodiment, as illustrated in FIG. 11, a metallic plating film 32 is provided on the surface 3a and the side surface 3b of the external connection terminals 3 which is exposed from the sealing resin layer 10. In the memory card 31 of the second embodiment, a metallic plating film 32 is provided on the external connection terminals 3, otherwise the memory card 31 is generally the same as memory card 1 according to the first embodiment. A recess portion surrounding the perimeter of the external connection terminals 3 is provided on the first surface 10a of the sealing resin layer 10 while exposing the surface 3a and a part of the side surface 3b of the external connection terminals 3.

The lead frame 2 is formed of Fe—Ni alloy (Fe-42% Ni alloy for example) or Cu alloy, for example. Thus, when used, there arises a possibility that oxidized layer is formed, or corrosion or rust forms on the surface 3a and the side surface 3b exposed to the outside. The metallic plating film 32 is formed on the exposed surface 3a and the exposed side surface 3b of the external connection terminals 3, in order to suppress the generation of an oxidized layer, corrosion or rust. Typical construction material for the metallic plating film 32 can be a precious metal such as Au and Pd. The metallic plating film 32 is not limited to a monolayer of Au and Pd, but also can be a stacked film such as an Au/Cu, Pd/Cu, Au/Ni, Pd/Ni, Au/Ni/Cu, Pd/Ni/Cu, Au/Pd/Ni, or Au/Pd/Ni/Cu. The memory card 31 can be operated without forming the metallic plating film 32 on the external connection terminals 3 depending on uses of the memory card 31.

A contact pin for electrolytic plating needs to be connected to the external connection terminals 3 in order to form the metallic plating film 32 by an electrolytic plating method on the exposed surface 3a and the exposed side surface 3b. In a previous step of formation of the metallic plating film 32, the surface 3a of the external connection terminals 3 is exposed. Thus, electrolytic plating can be performed on the exposed surface 3a and the exposed side surface 3b by having a contact pin for electrolytic plating contact the exposed surface 3a of the external connection terminals 3. However, if the electrolytic plating is performed by having the contact pin contact on the surface 3a of the external connection terminals 3, a plating metal may not attach to the area of the surface 3a where the contact pin contacted, which can result in an oxidized layer, corrosion, or rust.

Figure 12:
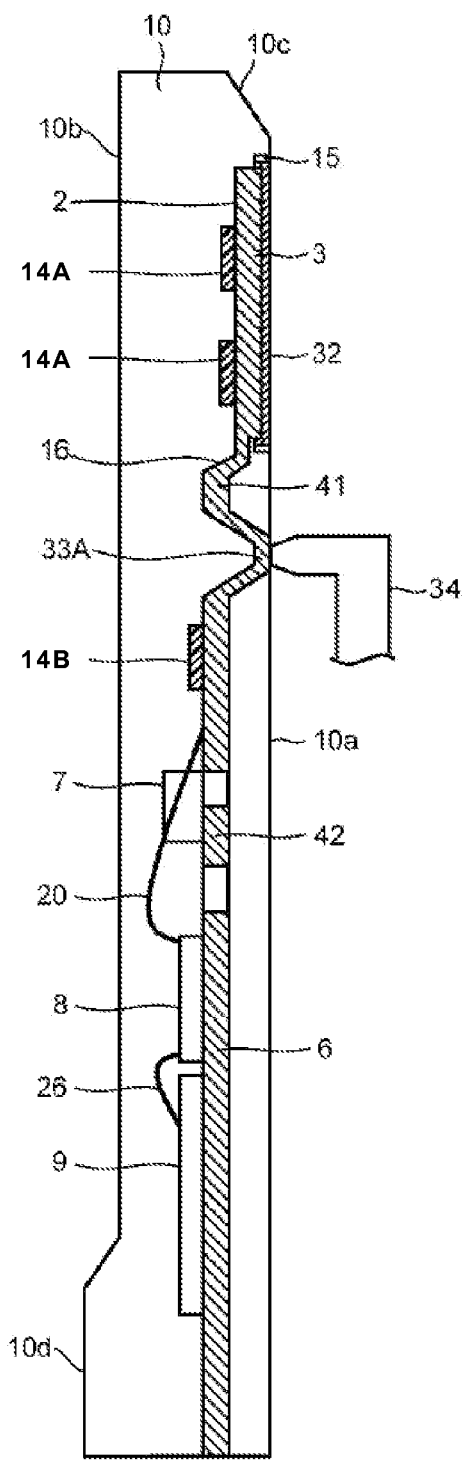
FIG. 12 illustrates a first technique for plating external connection terminals of the semiconductor memory card of the second embodiment.

In the memory card 31 in the second embodiment, the lead frame 2 has a connection for a plating terminal exposed from the sealing resin layer 10 other than the external connection terminals 3. FIG. 12 illustrates a first configuration example for the plating connection terminal 33. The lead frame 2 illustrated in FIG. 12 has a plating connection terminal 33A that is formed by bending the lead 41 so as to expose a part of the lead 41 connected to the external connection terminals 3 to the first surface 10a of the sealing resin layer 10. The lead 41 is bent once towards the first surface 10a of the sealing resin layer 10, a part of the lead 41 is placed at the same height as the first surface 10a, and then bent back to the height of the semiconductor chip mounting portion 6.

Figure 13:
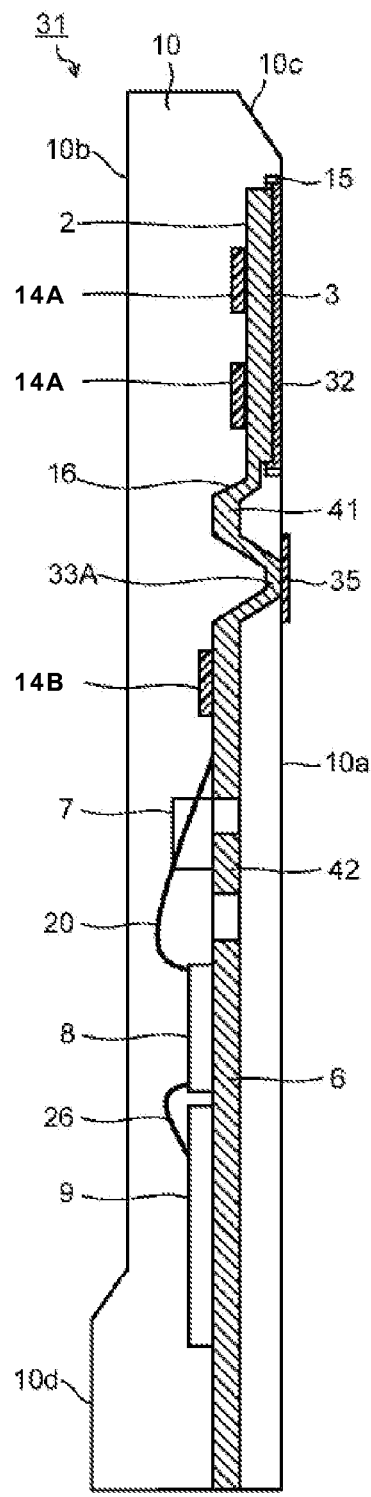
FIG. 13 is a cross-sectional view of the semiconductor memory card having external connection terminals plated according to the first technique.

As illustrated in FIG. 12, the metallic plating film 32 is formed onto the exposed surface 3a and the exposed side surface 3b of the external connection terminals 3 through electrolytic plating by having the contact pin for electrolytic plating 34 contact on the plating connection terminal 33A exposed from the sealing resin layer 10. Accordingly, the efficient formation of the metallic plating film 32 onto the whole surface of the exposed surface 3a and the exposed side surface 3b is achieved by the metallic plating method described above. Following the formation of the metallic plating film 32, as illustrated in FIG. 13, an insulating resin film 35 is formed on the first surface 10a so as to cover the plating connection terminal 33A. The insulating resin film 35 can be formed by applying an insulating film or an insulating resin paste.

The bending of the leads 41 can be enforced not only to the formation of the plating connection terminal 33A but also to the chip component mounting portion 5. The height of the chip component 7 is generally higher than that of the controller chip 8 or the memory chip 9. Thus, there arises a possibility that sealing efficiency of the chip component 7 by the sealing resin layer 10 is diminished due to a thinner resin thickness on the chip component 7, if the height of the chip component mounting portion 5 (the height of the sealing resin layer 10 from the first surface 10a) and that of the semiconductor chip mounting portion 6 after adjusting the height of the semiconductor chip mounting portion 6 so that the thickness from the semiconductor chip mounting portion 6 to the first surface 10a, T1, and the thickness from the top surface of the controller chip 8 and the memory chip 9 to the second surface 10b, T2, are roughly same.

Accordingly, a position gap of the semiconductor chip mounting portion 6 or generation of a warpage of the sealing resin layer 10 during the resin sealing steps can be suppressed while preventing the poor covering of the chip component 7 and associated exposure of the chip component 7 to the outside or the like; this can be achieved by allocating the chip component mounting portion 5 so that the chip component 7 is covered enough with the sealing resin layer 10 while allocating the semiconductor chip mounting portion 6 so that the thickness T1 and the thickness T2 are roughly same. Thus, it is possible to increase manufacturability and reliability of the memory card 31 using the lead frame 2.

Figure 14:
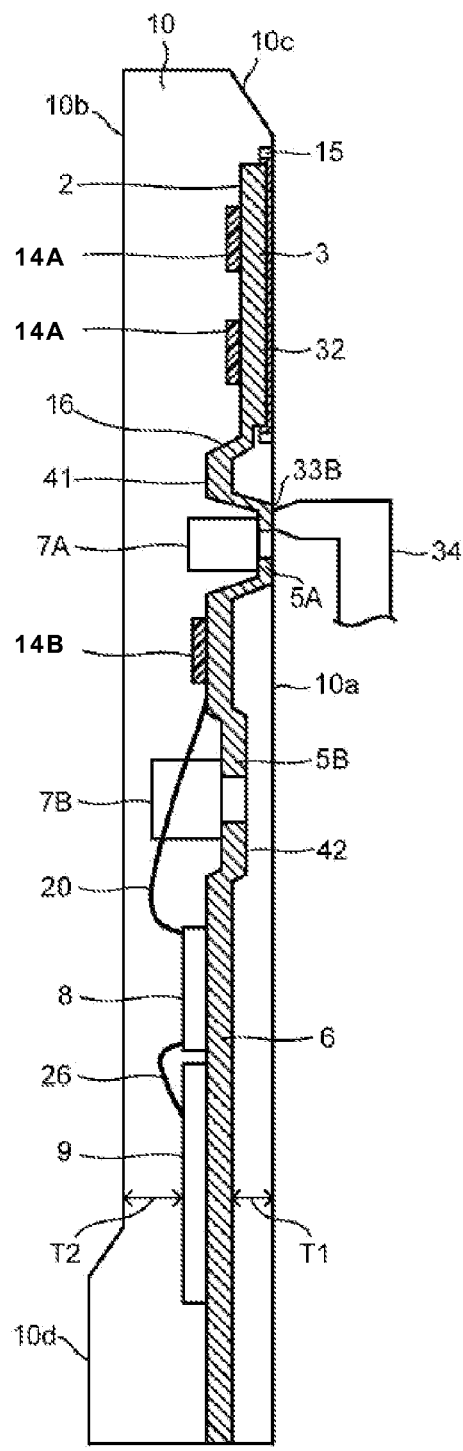
FIG. 14 illustrates a second technique for plating external connection terminals of the semiconductor memory card of the second embodiment.

The chip component mounting portion 5A and 5B illustrated in FIG. 14 are provided on the bent lead 41 and 42 so that those are allocated closer to the first surface 10a of the sealing resin layer 10 than the semiconductor chip mounting portion 6. The chip component mounting portion 5A of these is provided on the lead 41 so as to expose a part of the leads 41 to the first surface 10a of the sealing resin layer 10; and it shares a plating connection terminal 33B. Electrolytic plating can be performed by having the contact pin for electrolytic plating 34 contacts on the plating connection terminal 33B. The plating connection terminal 33B illustrated in FIG. 14 is covered with the insulating resin film 35 after forming the metallic plating film 32 as similar to the plating connection terminal 33A illustrated in FIG. 13.

Figure 15:
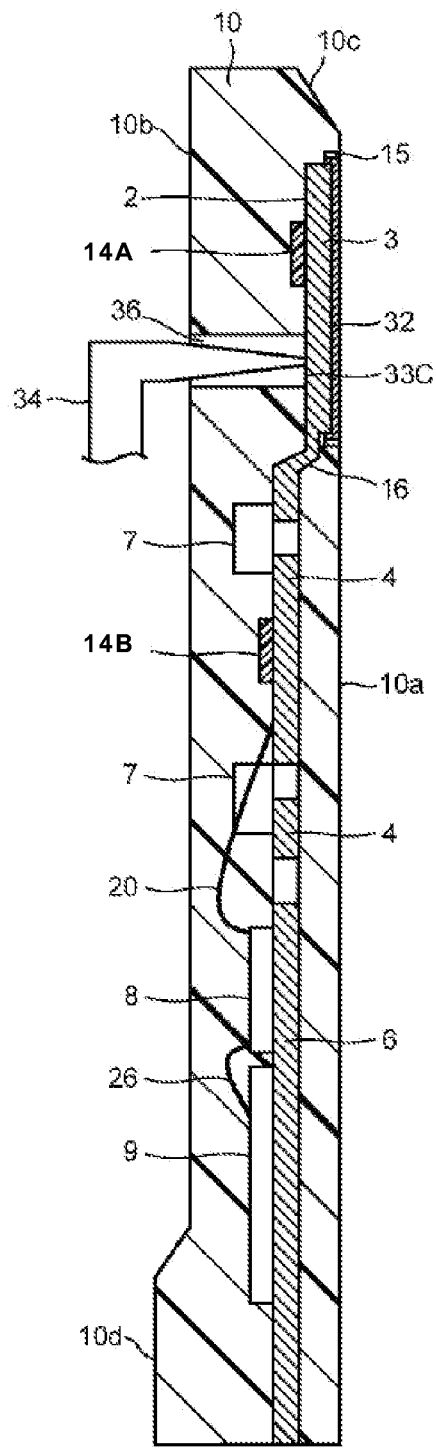
FIG. 15 illustrates a third technique for plating external connection terminals of the semiconductor memory card of the second embodiment.
Figure 16:
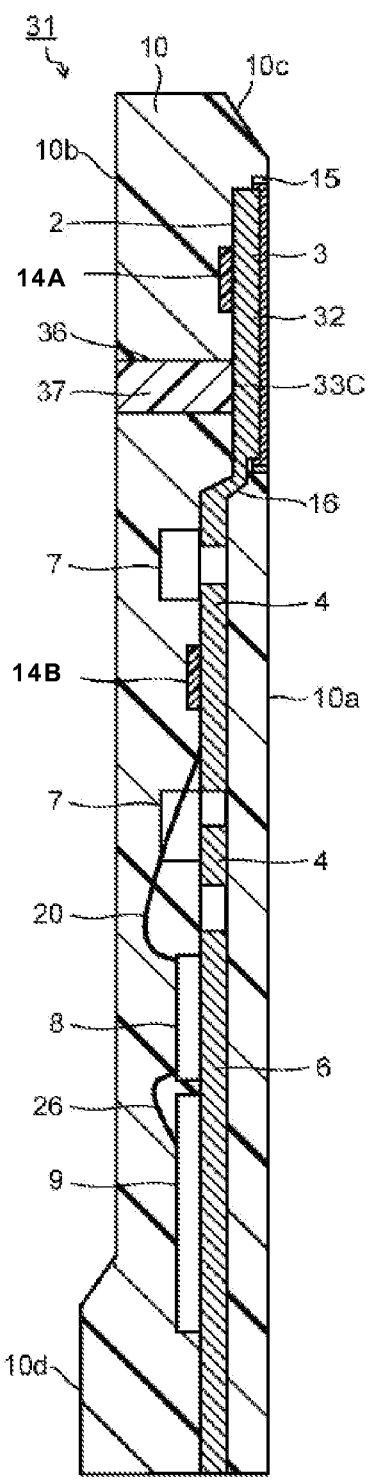
FIG. 16 is a cross-sectional view of the semiconductor memory card having external connection terminals plated according to the third technique.

FIG. 15 illustrates a second configuration example of the plating connection terminal 33. The memory card 31 illustrated in FIG. 15 has a opening 36 provided from the second surface 10b of the sealing resin layer 10 so as to expose the back side of the external connection terminals 3. A part of the back side of the external connection terminals 3 which is exposed within the opening 36; that portion functions as a plating connection terminal 33C. The efficient formation of the metallic plating film 32 onto the whole surface of the exposed surface 3a and the exposed side surface of the external connection terminals 3 exposed to the first surface 10a of sealing resin layer 10 can be achieved also through electrolytic plating by having the contact pin for electrolytic plating 34 contact on the back side of the external connection terminals 3 (the plating connection terminal 33C) which is exposed within the opening 36. As illustrated in FIG. 16, an insulating resin 37 will be filled inside the opening 36 after the formation of the metallic plating film 32. Alternatively, as same as the first configuration example, the insulating resin film 35 can be formed on the second surface 10b of the sealing resin layer 10 to fill up the opening 36.

Figure 17:
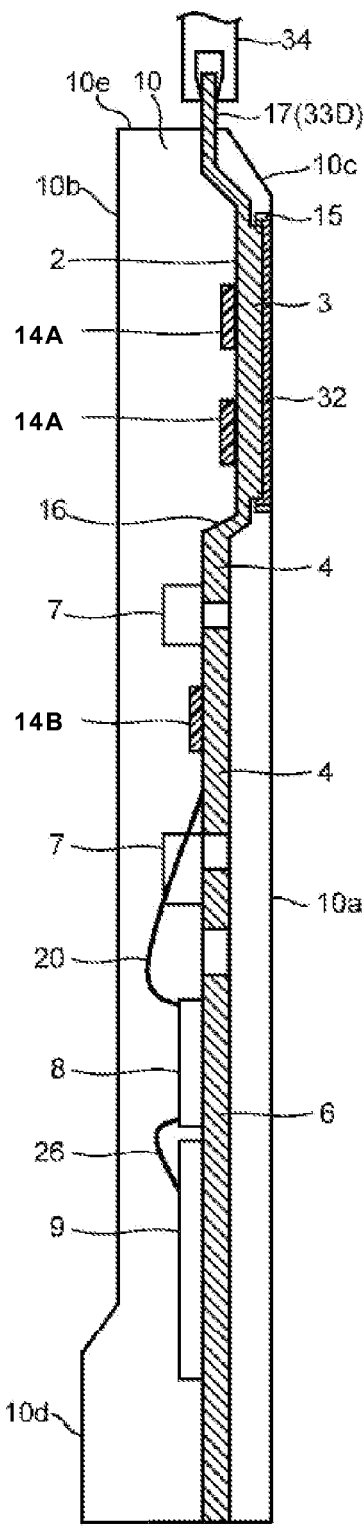
FIG. 17 illustrates a fourth technique for plating external connection terminals of the semiconductor memory card of the second embodiment.

FIG. 17 illustrates a third configuration example of the plating connection terminal 33. The hanging leads 17 are provided at the end of the external connection terminals 3 in the lead frame 2 illustrated in FIG. 17; the hanging leads 17 which are protruding from an end surface 10e of the sealing resin layer 10 function as plating connection terminal 33D. The efficient formation of the metallic plating film 32 onto the whole surface of the exposed surface 3a and the exposed side surface of the external connection terminals 3 exposed to the first surface 10a of sealing resin layer 10 can be achieved also through electrolytic plating by having a contact pin for electrolytic plating 38 contact on the plating connection terminal 33D which is protruding from the sealing resin layer 10. Following the formation of the metallic plating film 32, as illustrated in FIG. 18, the insulating resin film 35 is formed on the end surface 10e after cutting off the protruding portion of the hanging leads 17 from the end surface 10e of the sealing resin layer 10. The insulating resin film 35 is formed by applying an insulating film or applying an insulating resin paste, as similar to the first configuration example.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory card, comprising:
  a lead frame including a plurality of external connection terminals and a lead portion having a plurality of leads with at least one lead connected to the external connection terminals;
  a controller chip mounted on the lead frame and electrically connected to the at least one lead;
  a memory chip mounted on the lead frame and electrically connected to the controller chip;
  a sealing resin layer that seals the lead frame, the controller chip, and the memory chip, the sealing resin layer having a surface at which the external connection terminals are exposed and a portion that is between the external connection terminals and covers a first part of a side surface of each of the external connection terminals; and
  a recess in the sealing resin layer at the surface, the recess surrounding the external connection terminals and exposing a second part of the side surface of each of the external connection terminals, wherein a bottom surface of the recess is located between a front surface of the external connection terminals and a back surface of the external connection terminals.

2. The semiconductor memory card according to claim 1, further comprising:
a metallic plating film, formed by electrolytic plating, that covers the exposed second part of the side surfaces of the external connection terminals.

3. The semiconductor memory card according to claim 2, wherein the metallic plating film comprises a precious metal.

4. The semiconductor memory card according to claim 1, wherein the lead frame has a connection terminal for coming into electrical contact with a plating contact pin, the connection terminal being located at a position other than the external connection terminals.

5. The semiconductor memory card according to claim 4, wherein the connection terminal extends to the surface.

6. The semiconductor memory card according to claim 4, further comprising an insulating resin film covering the connection terminal.

7. The semiconductor memory card according to claim 1, wherein the recess is a single indentation surrounding the external connection terminals.

8. The semiconductor memory card according to claim 1, wherein the recess comprises a plurality of indentations each surrounding a different external connection terminal.

9. The semiconductor memory card according to claim 1, wherein the recess has a depth from the surface that is between ten microns and three hundred microns.

* * * * *